(12) United States Patent
Nishiyama et al.

(10) Patent No.: US 7,046,513 B2
(45) Date of Patent: May 16, 2006

(54) COOLING STRUCTURE FOR ELECTRONIC DEVICES

(75) Inventors: Shinichi Nishiyama, Ninomiya (JP); Yasuji Morishita, Odawara (JP); Yasuyuki Katakura, Odawara (JP); Youji Okabe, Odawara (JP); Tadaharu Maeda, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 315 days.

(21) Appl. No.: 10/719,821

(22) Filed: Nov. 20, 2003

(65) Prior Publication Data

US 2004/0264131 A1 Dec. 30, 2004

(30) Foreign Application Priority Data

Jun. 24, 2003 (JP) ............................. 2003-180136

(51) Int. Cl.
*H05K 7/20* (2006.01)
(52) U.S. Cl. ................... 361/695; 361/688; 361/689; 361/690; 361/694; 165/80.2; 165/122; 174/15.1; 174/16.1; 454/185
(58) Field of Classification Search ........ 361/687–690, 361/694–695; 454/184, 181; 165/80.2, 165/122; 174/15.1, 16.1
See application file for complete search history.

(56) References Cited

U.S. PATENT DOCUMENTS

| | | | |
|---|---|---|---|
| 4,774,631 A * | 9/1988 | Okuyama et al. ........... 361/695 |
| 5,063,475 A | 11/1991 | Balan | |
| 5,136,464 A | 8/1992 | Ohmori | |
| 5,297,005 A | 3/1994 | Gourdine | |
| 5,361,188 A | 11/1994 | Kondou et al. | |
| 5,398,159 A * | 3/1995 | Andersson et al. ......... 361/695 |
| 5,544,012 A * | 8/1996 | Koike ........................ 361/695 |
| 5,832,988 A * | 11/1998 | Mistry et al. ............... 165/103 |
| 6,052,282 A * | 4/2000 | Sugiyama et al. .......... 361/690 |
| 6,119,768 A * | 9/2000 | Dreier et al. .......... 165/104.33 |
| 6,198,628 B1 * | 3/2001 | Smith ......................... 361/695 |
| 6,678,156 B1 * | 1/2004 | Moizer ....................... 361/690 |
| 6,778,386 B1 * | 8/2004 | Garnett et al. .............. 361/687 |
| 6,927,980 B1 * | 8/2005 | Fukuda et al. .............. 361/700 |
| 2004/0004813 A1 | 1/2004 | Coglitore et al. | |
| 2005/0168945 A1 * | 8/2005 | Coglitore .................... 361/695 |

FOREIGN PATENT DOCUMENTS

| | | |
|---|---|---|
| JP | 05-204493 | 8/1993 |
| JP | 06-084338 | 3/1994 |
| JP | 07-020994 | 1/1995 |

(Continued)

*Primary Examiner*—Lynn Feild
*Assistant Examiner*—Robert J. Hoffberg
(74) *Attorney, Agent, or Firm*—Townsend and Townsend and Crew LLP

(57) ABSTRACT

A cooling structure for electronic devices includes a plurality of electronic device accommodating boxes, in which electronic devices are accommodated, disposed in a casing in multiple stages. A vent portion which allows ventilation between the inside and the outside of the casing is formed in a ceiling of the casing. In a first accommodating portion for accommodating the first electronic device accommodating box which is defined at the stage close to the ceiling, a hollow duct having two opening faces is arranged. The first opening face faces the vent portion and the second opening face faces a second accommodating portion for accommodating the second electronic device accommodating box which is defined at the stage remote from the ceiling. Air inside the second electronic device accommodating box is discharged through the inside of the duct. Air inside of the first electronic device accommodating box is discharged from the vent portion.

18 Claims, 17 Drawing Sheets

FOREIGN PATENT DOCUMENTS

| | | |
|---|---|---|
| JP | 09-312255 | 12/1997 |
| JP | 10-205830 | 8/1998 |
| JP | 10-275514 | 10/1998 |
| JP | 2000-122815 | 4/2000 |

* cited by examiner

COOLING STRUCTURE FOR ELECTRONIC DEVICES

BACKGROUND OF THE INVENTION

1. Field of the Invention

The present invention relates to a cooling structure for electronic devices.

2. Description of the Related Art

Along with the progress of the information technology, large-sizing and the increase of packing density of a storage device used as a memory device in an information processing system has been in a progress. In such a storage device, it is necessary to efficiently discharge heat generated within to the outside. For this end, conventionally, several measures for efficiently discharging heat to the outside including the improvement of arrangement of electronic devices inside the storage device have been considered. Particularly, among electronic devices which are mounted in the storage device, a power source device which converts an AC power fetched from the outside into a DC power constitutes one of large heat generating sources. Accordingly, the conventional storage device has been configured such that the power source device is arranged above a casing or below a fan (an exhaust device) so as to readily discharge the heat from the power source device to the outside of the casing.

SUMMARY OF THE INVENTION

However, usually, the AC power is fetched from a plug socket or the like which is arranged below a floor of a computer room. In this case, when the power source device is arranged at an upper portion of the casing of the storage device, wiring for AC current and wiring for DC current are present in a mixed state and hence, it has been necessary to take a countermeasure for erroneous wiring, a countermeasure for noises and the like.

On the other hand, when the power source device is arranged below the casing, there arises a problem with respect to the manner of discharging heat generated by the power source device. Further, in the casing in which electronic devices are accommodated in multiple stages besides the power source device, how to cool the electronic devices accommodated in a lower portion of the casing effectively constitutes a serious problem which is not limited to the storage devices.

The present invention has been made in view of such problems and it is a primary object of the present invention to provide a cooling structure for electronic devices.

To solve the above-mentioned problem, the present invention is related to a cooling structure for electronic devices wherein a plurality of electronic device accommodating boxes, in which electronic devices are accommodated, are disposed in a casing in multiple stages, a vent portion which allows ventilation between the inside and the outside of the casing is formed in a ceiling of the casing, in a first accommodating portion for accommodating the first electronic device accommodating box which is defined at the stage close to the ceiling, a hollow duct having two opening faces is arranged, the first opening face faces the vent portion and the second opening face faces a second accommodating portion for accommodating the second electronic device accommodating box which is defined at the stage remote from the ceiling, air inside of the second electronic device accommodating box which is accommodated in the second accommodating portion is discharged outside the casing from the vent portion through the inside of the duct, and air inside of the first electronic device accommodating box which is accommodated in the first accommodating portion is discharged outside the casing from the vent portion along an outer wall surface of the duct.

Due to such a constitution, it is possible to effectively cool the electronic device accommodated in the lower stage of the casing.

Other problems and the manner of solving the problems which the present application discloses, are made apparent in conjunction with columns of the embodiment of the present invention and drawings.

DETAILED DESCRIPTION OF THE INVENTION

Hereinafter, an embodiment of the present invention is explained in detail by taking a storage device as an example.

Figure 1:
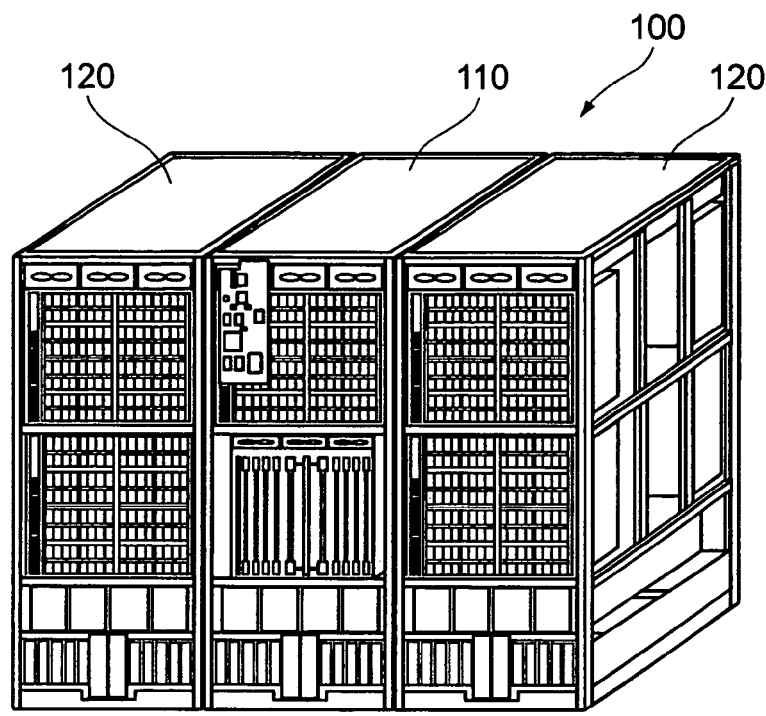
FIG. 1 is a view showing the constitution in appearance of a storage device according to an embodiment of the present invention.
Figure 2:
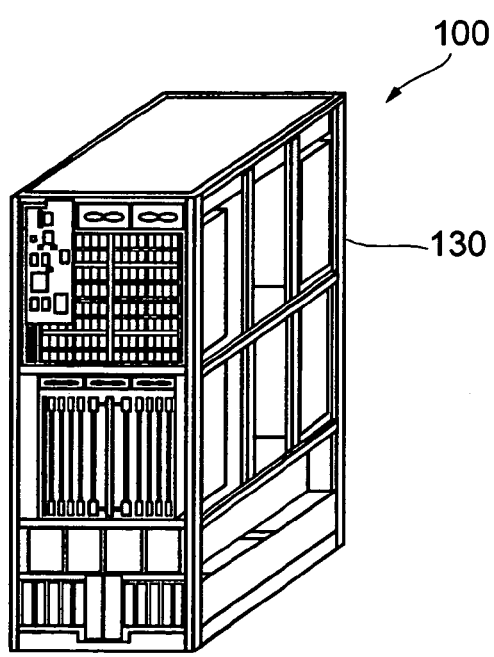
FIG. 2 is a view showing the constitution in appearance of the storage device according to an embodiment of the present invention.

First of all, the constitution in appearance of a storage device 100 provided with a cooling structure for electronic devices according to this embodiment is explained in conjunction with FIG. 1 and FIG. 2.

Figure 11:
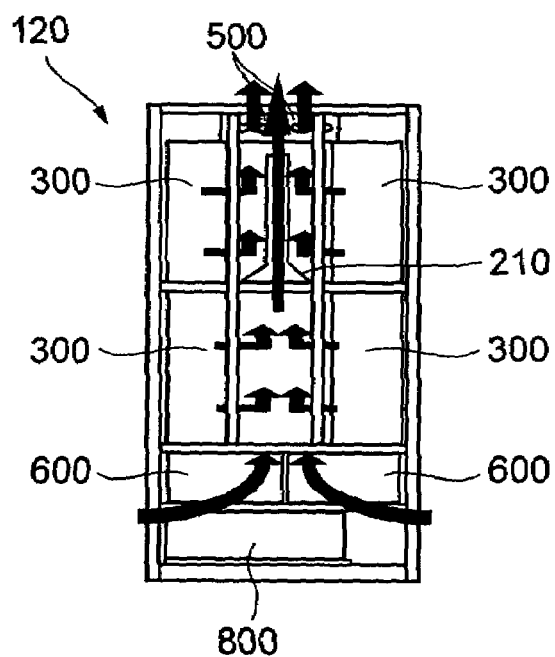
FIG. 11 is a view for explaining a cooling structure of a driver of a storage device according to an embodiment of the present invention.

The storage device 100 shown in FIG. 11 is constituted of a controller 110 and drivers 120. In an example shown in FIG. 1, the controller 110 is arranged at the center of the storage device 100 and the drivers 120 are arranged at the left and right sides of the storage device 100.

The controller 110 performs a control of the whole storage device 100. Although the explanation of the detail of the controller 110 is described later, in the controller 110, a logic part 420 which performs a control of the whole storage device 100 and disc drives 310 for storing data are accommodated in the front-face side and the rear-face side.

On the other hand, in the driver 120, disc drives 310 are accommodated in the front-face side and the rear-face side. In the case of expanding the size of the storage device 100, the driver 120 is added. Accordingly, to cope with needs of users, a storage capacity of the storage device 100 can be flexibly changed and hence, it is possible to provide the storage device 100 having high expansion characteristics.

On the other hand, the storage device shown in FIG. 2 is constituted as an integral-type device 130 in which a DC power source 600, a battery 800, an AC-BOX 700 and the like are accommodated in one casing 200 besides the logic part 420 and the disc drives 310. The storage device 100 having the constitution shown in FIG. 2 is a device in which functions necessary for the storage device 100 are accommodated in the inside of one casing.

Subsequently, the respective inner structures of the controller 110, the driver 120 and the integral-type device 130 are explained in conjunction with FIG. 3 to FIG. 7.

Figure 3:
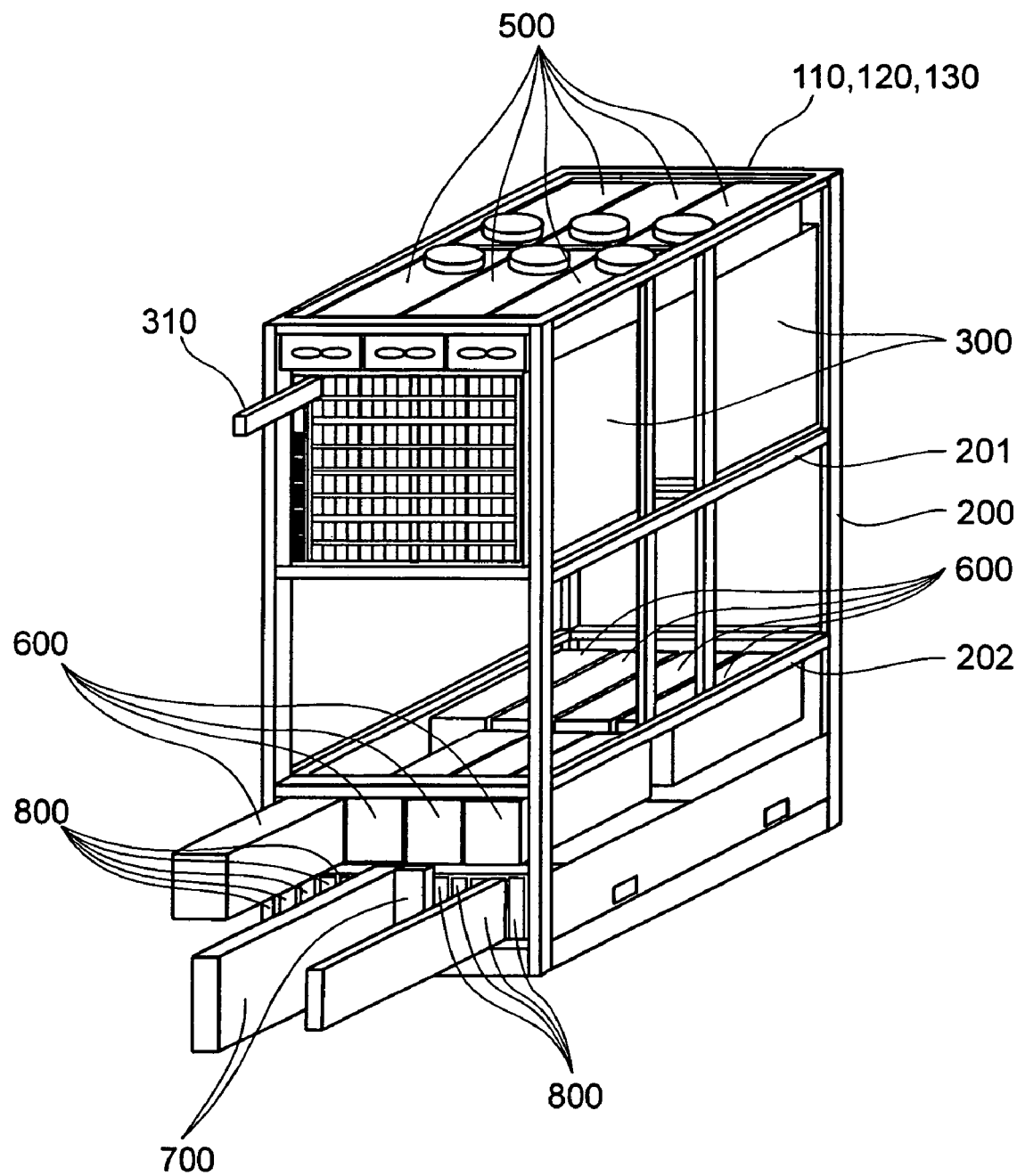
FIG. 3 is a view for explaining the detailed constitution of the storage device according to an embodiment of the present invention.

First of all, the constitution which is provided to the controller 110, the drivers 120 and the integral-type device 130 in common is shown in FIG. 3. With respect to the controller 110, the driver 120 and the integral-type device 130, a disc drive module (a first electronic device accommodating box) 300 in which a plurality of disc drives (electronic devices) 310 are accommodated in a neatly arranged manner is accommodated in an upper stage (a first accommodating portion for accommodating the first electronic device accommodating box which is defined at a stage close to a ceiling) of the casing 200. Further, the buttery 800, the AC-BOX 700 and the DC power source 600 are accommodated in a lower stage of the casing 200. These battery 800, Ac-BOX 700 and DC power source 600 are hereinafter also referred to as a power source part. The power source part also constitutes an electronic device. In the ceiling of the casing 200, a vent portion which allows the ventilation between the inside and the outside of the casing 200 is formed. In the vent portion according to this embodiment, a fan (an air discharging device) 500 which sucks air inside of the casing 200 and discharges the air to the outside of the casing 200 is arranged. It is needless to say that the air inside of the casing 200 may be discharged naturally without providing the air discharging device-such as the fan 500 to the vent portion. Further, a gas suction device which is installed separately from the storage device 100 may be communicated with a vent portion using a duct or the like and the air inside of the casing 200 may be discharged by the gas suction device.

Although not shown in FIG. 3, in a middle stage (a second accommodating portion for accommodating the second electronic device accommodating box which is defined at a stage remote from the ceiling) of the casing 200, a logic module (the second electronic device accommodating box) 400 is accommodated with respect to the controller 110 or the integral-type device 130, while the disc drive module (the second electronic device accommodating box) 300 is accommodated with respect to the driver 120. The detail of these constitutions is described later. The second accommodating portion may be constituted of only the middle stage or may be constituted of the middle stage and the lower stage.

The above-mentioned upper stage, the middle stage and the lower stage of the casing 200 are partitioned by an upper partition portion 201 and a lower partition portion 202.

Figure 4:
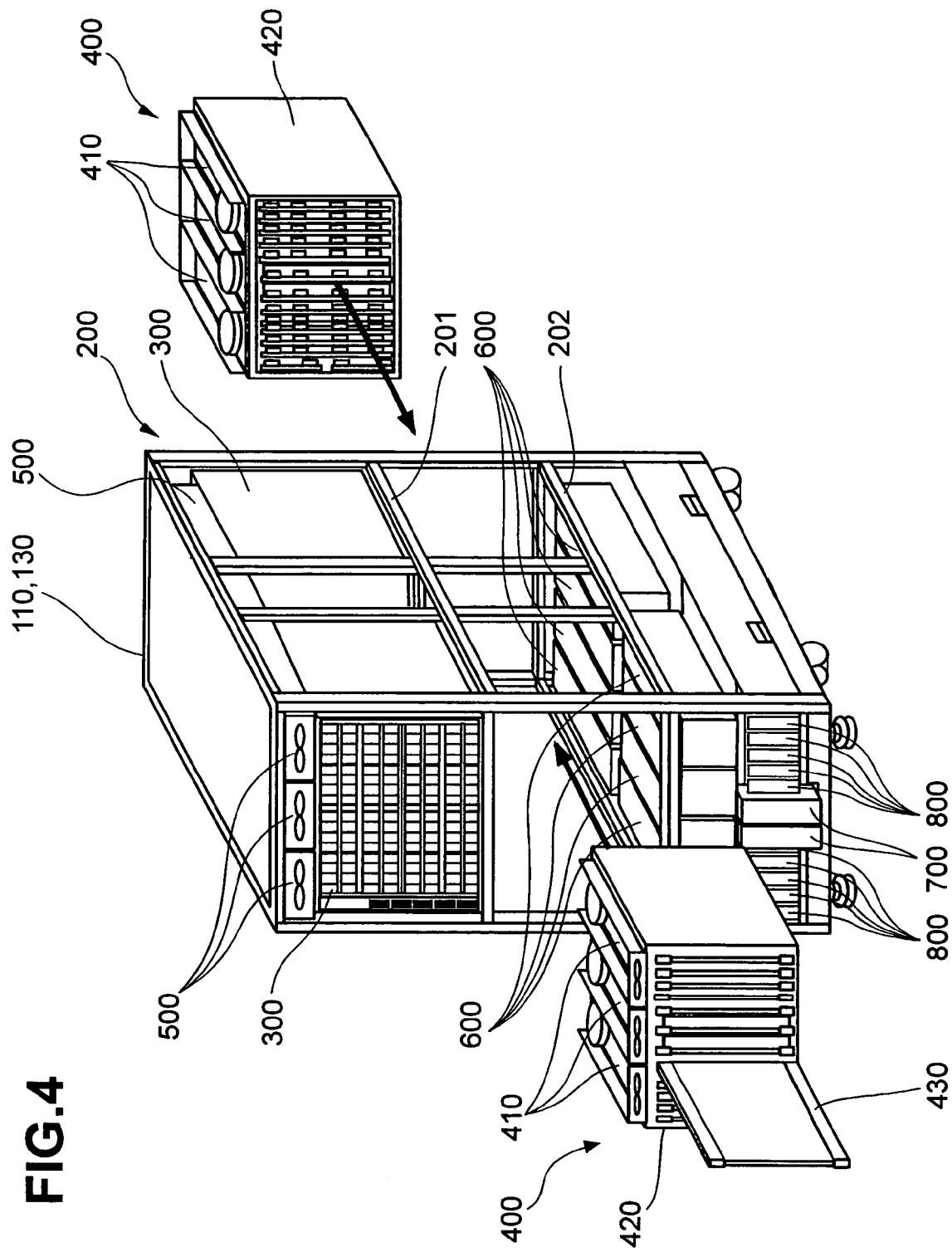
FIG. 4 is a view showing the manner of accommodating a box for a control part in a controller of the storage device according to an embodiment of the present invention.
Figure 6:
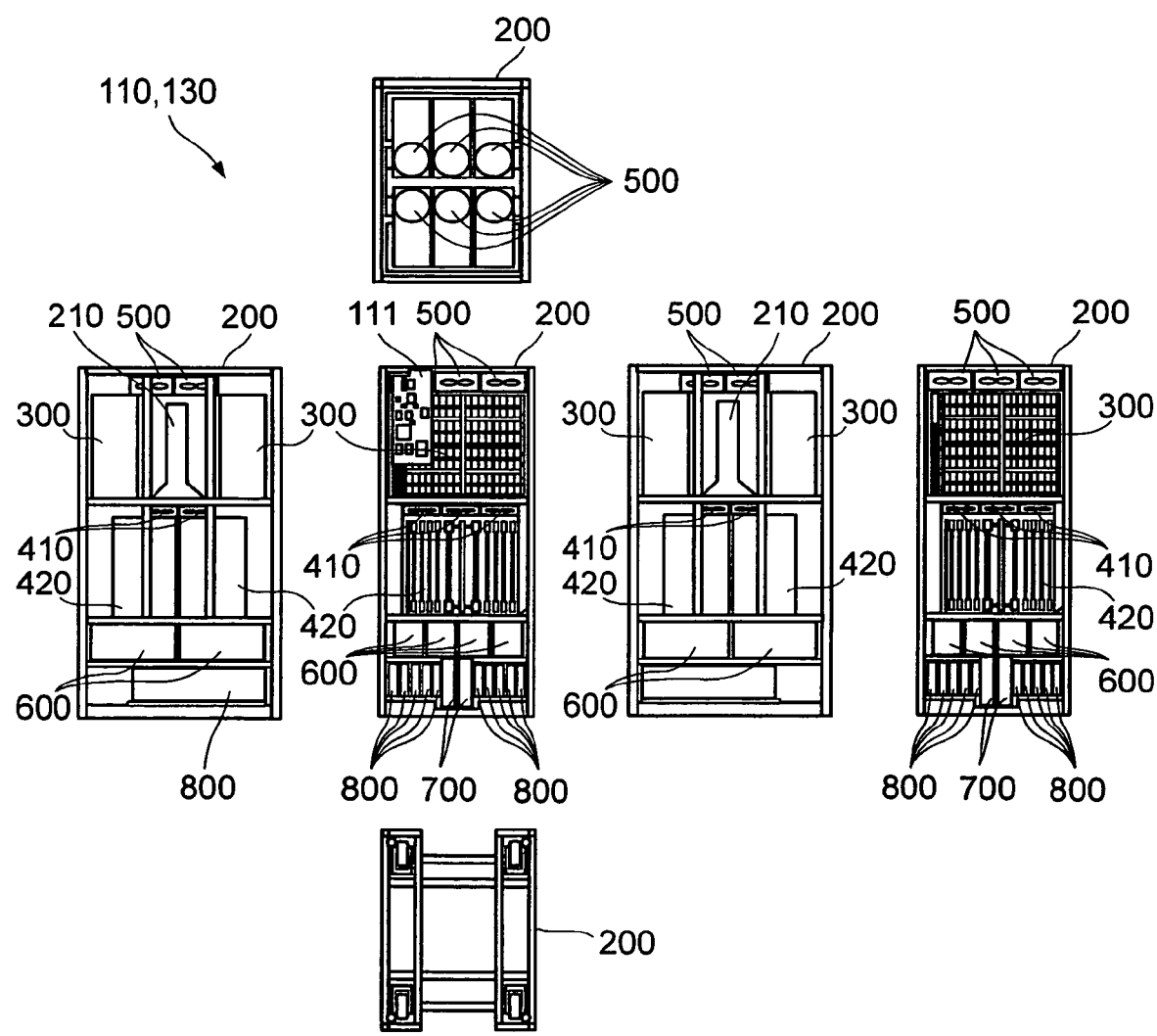
FIG. 6 is a view showing the detailed constitution of a controller of a storage device according to an embodiment of the present invention.

As mentioned above, with respect to the controller 110 and the integral-type device 130, the logic module 400 is accommodated in the middle stage of the casing 200. This state is shown in FIG. 4. Further, a six-plane view which shows the detailed constitutions of the controller 110 and the integral-type device 130 is shown in FIG. 6.

The controller 110 and the integral-type device 130 are constituted by accommodating the logic module 400, the disc drive module 300, the DC power source 600, the AC-BOX 700, the battery 800 and the fan 500 in the casing 200. Further, in the controller 110 and the integral-type device 130, an operator panel 111 which accepts manipulation inputting by an operator who maintains and controls the storage device 100 is provided.

As shown in FIG. 4, the logic module 400 is replaceably accommodated in the casing 200. The logic module 400 includes a logic part (an electronic device) 420 for performing a control of the storage device 100 and a logic module fan 410. Logic printed circuit boards (electronic devices, control boards) 430 are accommodated in the logic part 420 replaceably and in a neatly arranged manner. Due to such a constitution, various controls of the storage device 100 can be performed. As the logic printed circuit boards 430 accommodated in the logic part 420, for example, a channel adapter which performs communication for inputting and outputting of data between the storage device 100 and an information processing device which utilizes the storage device 100 as a memory device, a disc adaptor which performs inputting and outputting processing with respect to data stored in the disc drive 310, a cache memory for storing data which is transmitted or received between the information processing device and the storage device 100 and the like are named. Here, these logic printed circuit boards 430 are, as shown in FIG. 4 and FIG. 6, accommodated in the inside of the logic part 420 such that all of them are neatly arranged in the same direction in parallel. However, it is possible to accommodate the logic printed circuit boards 430 such that the logic printed circuit boards 430 which are neatly arranged in the longitudinal direction and the logic printed circuit boards 430 which are arranged neatly in the lateral direction are accommodated in a mixed state.

The logic module fan 410 sucks air from the logic part 420 and the power source part so as to perform cooling thereof. The air sucked into the logic module fan 410 is discharged to the outside of the casing 200 by a fan 500 mounted on an upper stage of the casing 200.

In the upper stage of the casing 200, the disc drive module 300 is replaceably accommodated. The disc drive module 300 accommodates a disc drive 310 for storing data. The disc drive 310 is a device for storing data which is provided with a recording medium inside thereof. As the disc drive 310, various devices including a hard disc device, a semiconductor memory device and the like can be adopted, for example.

The fan 500 discharges air inside of the controller 110 or the integral-type device 130 to the outside. Accordingly, it is possible to discharge heat generated by the disc drive module 300, the logic module 400 and the power source part to the outside of the controller 110 and the integral-type device 130. Air inside of the logic module 400 which is accommodated in the middle stage of the casing 200 and air inside of the power source part which is accommodated in the lower stage are discharged to the outside of the controller 110 and the integral-type device 130 through the inside of an air duct 210 formed in the upper stage of the casing 200 due to the actuation of the fan 500. Further, air inside of the disc drive module 300 which is accommodated in the upper stage of the casing 200 is discharged to the outside of the controller 110 and the integral-type device 130 along an outer wall surface of the air duct 210 due to the actuation of the fan 500.

The power source part is accommodated in the lower portion of the casing 200. The power source part is replaceably accommodated in the casing 200. The DC power source 600 converts the AC power into the DC power and is provided with a power source device which supplies the DC power to the logic module 400 and the disc drives 310. Here, in the logic module 400 and the disc drive 310, the powers of a plurality of rated voltages are consumed. For example, in the logic module fan 410, the DC power of the rated 12V is consumed. Further, in the logic printed circuit board 430, the DC power of the rated 5V or the rated 3.3V is consumed. Accordingly, the logic module 400 and the disc drive module 300 according to this embodiment are provided with a voltage converter (a DC-DC converter). Due to such a constitution, it is possible to supply the DC power having the same rated voltage to the logic module 400 and the disc drive 310 from the DC power source 600.

The battery 800 is a stand-by power source device for supplying power to each device inside of the controller 110 and the integral-type device 130 at the time of interruption of service and at the time of the occurrence of abnormality in the DC power source 600.

The AC-BOX 700 is a port for fetching the AC power with respect to the storage device 100 and functions as a breaker. The AC power fetched to the AC-BOX 700 is supplied to the DC power source 600.

Since the current which flows inside of the storage device 100 flows into the power source part in a concentrated manner, a heat value is large. In the storage device 100 according to this embodiment, the power source part is accommodated in the lower portion of the casing 200. Accordingly, there arises a problem with respect to the treatment of the heat generated from the power source part. In this embodiment, air heated by the power source part is sucked by the logic module fan 410 and is discharged to the outside of the casing 200 through the inside of the air duct 210 arranged in the upper portion of the casing 200. Due to such a constitution, in this embodiment, it is possible to discharge the heat to the outside from the power source part without allowing the heat to stay inside of the casing 200 and hence, it is possible to accommodate the power source part in the lower stage of the casing 200.

Figure 5:
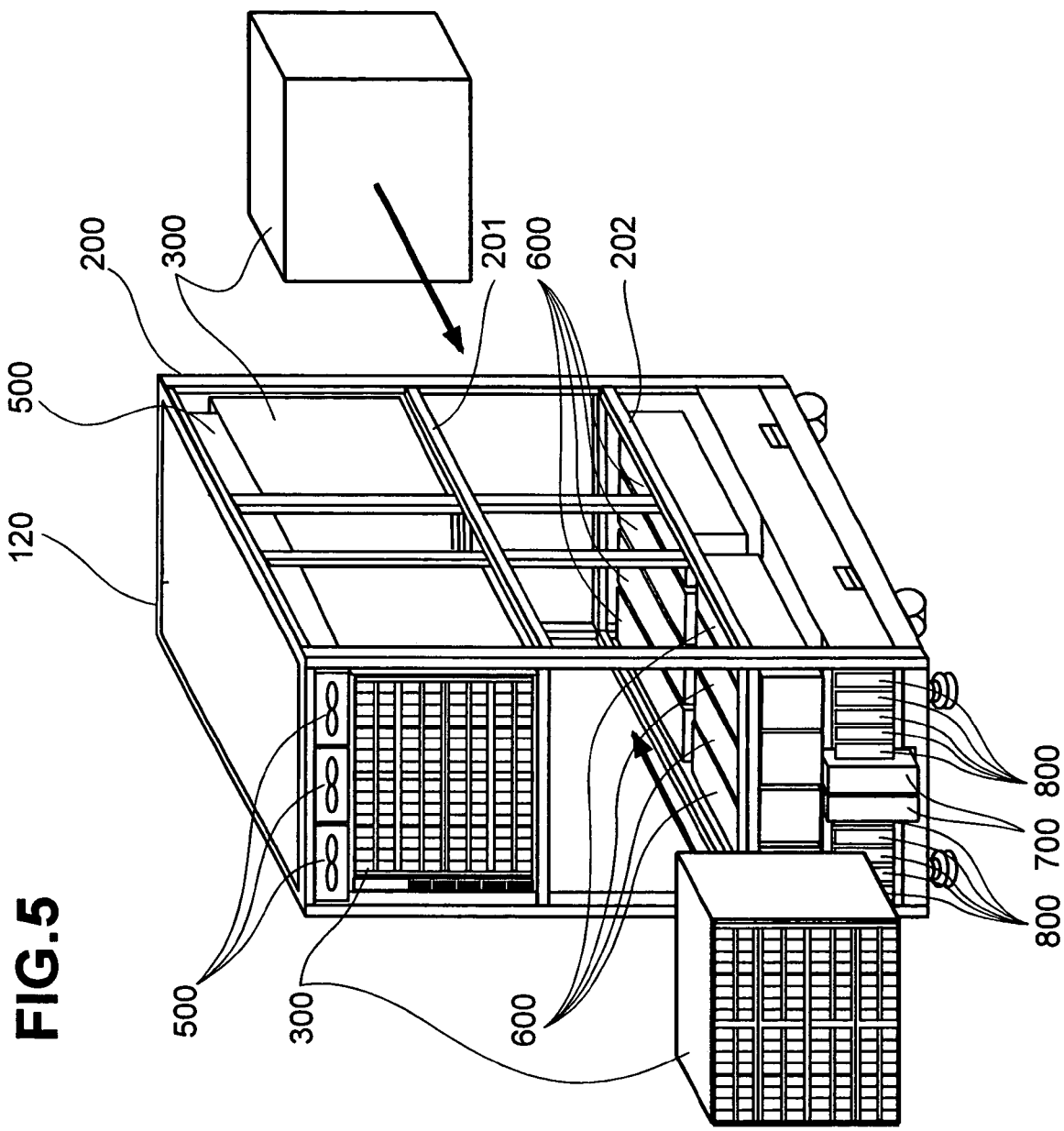
FIG. 5 is a view for showing the manner of accommodating a box for a disc drive in a driver of a storage device according to an embodiment of the present invention.
Figure 7:
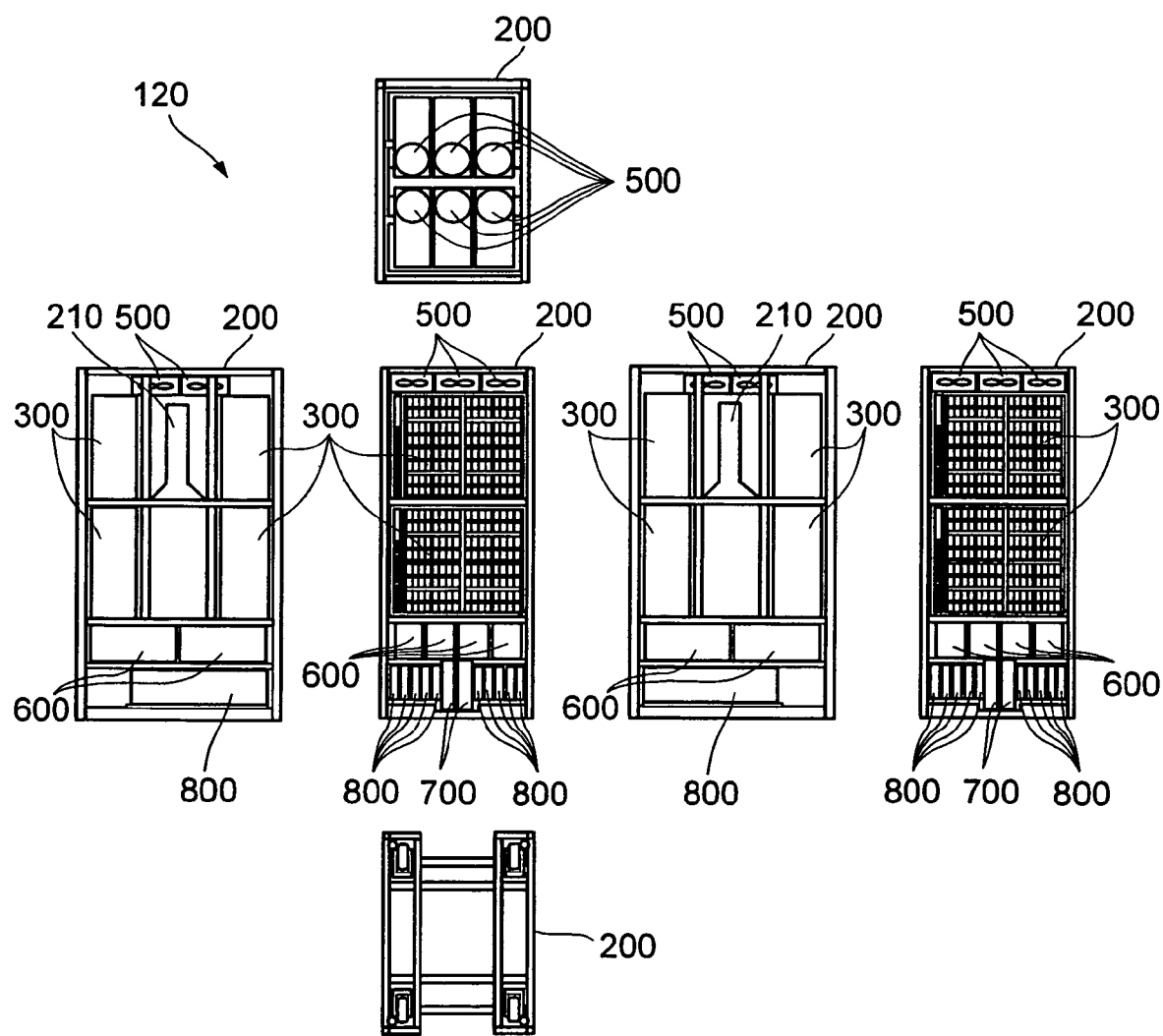
FIG. 7 is a view showing the detailed constitution of a driver of a storage device according to an embodiment of the present invention.

On the other hand, the driver 120 is configured such that the disc drive module 300 is accommodated in the middle stage of the casing 200. This state is shown in FIG. 5. Further, a six-face view showing the detailed constitution of the driver 120 is shown in FIG. 7.

The driver 120 is constituted such that the disc drive module 300, the DC power source 600, the AC-BOX 700, the battery 800 and the fan 500 are accommodated in the casing 200. These respective modules and the like are equal to those which are accommodated in the controller 110 and the integral-type device 130. In the storage device 100 according to this embodiment, all of the controller 110, the driver 120 and the integral-type device 130 are constituted by using the common casing 200. Further, with respect to the driver 120, in the middle stage of the casing 200 in which the logic module 400 is accommodated with respect to the controller 110, the disc drive module 300 is accommodated.

The fan 500 sucks air inside of the disc drive module 300 and the power source part which are accommodated inside of the casing 200 and discharges the air to the outside of the driver 120. Accordingly, heat generated by the disc drive 310 which is accommodated in the disc drive module 300 and the heat generated from the power source part can be discharged to the outside of the driver 120. Here, the driver 120 is also provided with the air duct 210 inside of the casing 200. Accordingly, air inside of the disc drive module 300 which is accommodated in the middle stage of the casing 200 and the air inside of the power source part which is accommodated in the lower stage of the casing are discharged to the outside of the driver 120 through the inside of the air duct 210 by the actuation of the fan 500. Further, the air inside of the disc drive module 300 which is accommodated in the upper stage of the casing 200 is discharged to the outside of the controller 110 and the integral-type device 130 along an outer wall surface of the air duct 210 due to the actuation of the fan 500.

Next, these cooling structure for electronic devices according to this embodiment is explained in conjunction with FIG. 8 to FIG. 18.

Figure 8:
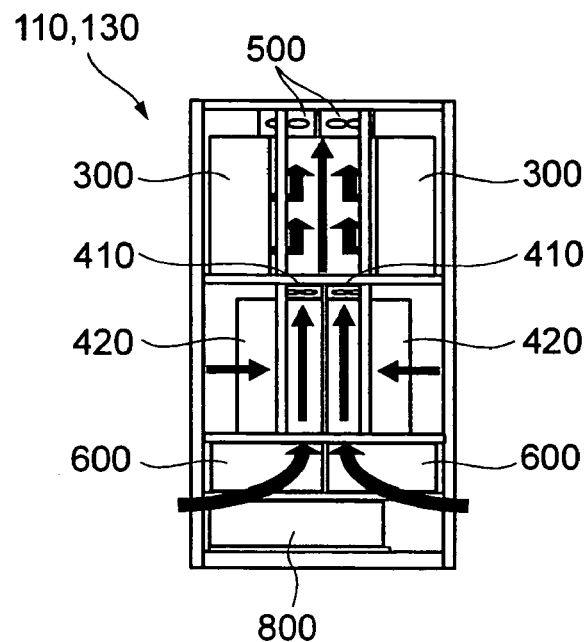
FIG. 8 is a view for explaining a cooling structure of a controller of a storage device according to an embodiment of the present invention.
Figure 9:
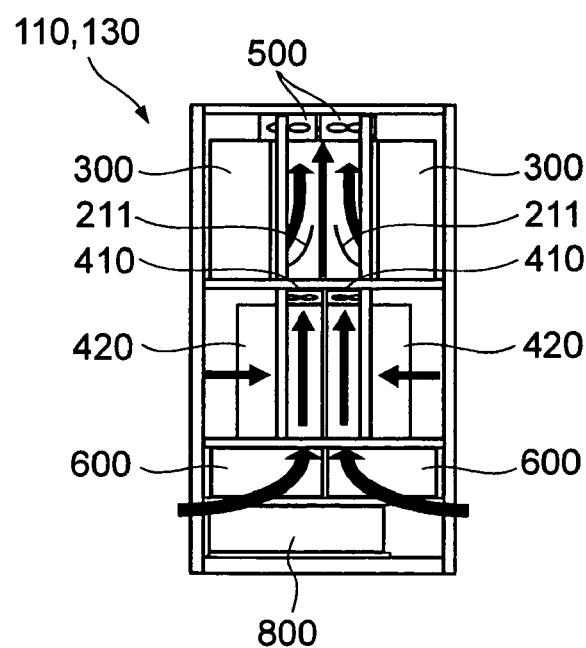
FIG. 9 is a view for explaining a cooling structure of a controller of a storage device according to an embodiment of the present invention.
Figure 10:
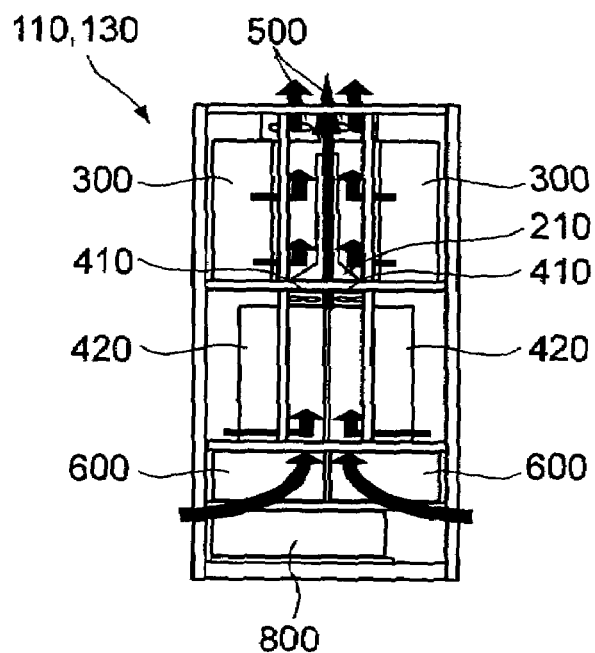
FIG. 10 is a view for explaining a cooling structure of a controller of a storage device according to an embodiment of the present invention.

First of all, the cooling structure for electronic devices in the controller 110 or the integral-type device 130 according to this embodiment is explained in conjunction with FIG. 8 to FIG. 10. Here, FIG. 11 is a view for explaining the cooling structure for electronic devices in the driver 120.

The controller 110 or the integral-type device 130 according to this embodiment includes the fan 500, the disc drive module 300, the logic part 420, the logic module fan 410 and the power source part (the DC power source 600, the AC-BOX 700, the battery 800). By discharging the air inside of the disc drive module 300, the logic module 400 and the power source part to the outside due to the actuation of the fan 500 and the logic module fan 410, the disc drive 310, the logic part 420 and the power source part are cooled. Here, it is desirable from a viewpoint of enhancement of cooling efficiency that the air inside of the casing 200 is discharged to the outside without staying inside of the casing. In the controller 110 and the integral-type device 130 according to this embodiment, the disc drive module 300 is accommodated in the upper stage of the casing 200, the logic module 400 is accommodated in the middle stage of the casing 200, and the power source part is accommodated in the lower stage of the casing 200. Due to such an arrangement, in the controller 110 and the integral-type device 130 according to this embodiment, it is possible to enhance the discharge efficiency.

That is, as shown in FIG. 8, the disc drive module 300 which is accommodated in the upper stage of the casing 200 has a short depth compared to the logic module 400 and the power source part. Accordingly, when the disc drive module 300 is accommodated in the casing 200, it is possible to ensure a large space which is formed between the disc drive module 300 accommodated at the front-surface side and the disc drive module 300 accommodated at the rear-surface side. Due to such a constitution, it is possible to ensure a large ventilation passage of a cooling wind sucked by the fan 500. That is, the air inside of the casing can be discharged to the outside efficiently.

Further as shown in FIG. 8, the power source part which is accommodated in the lower stage of the casing 200 has a long depth compared to the drive module 300 and the logic module 400. Accordingly, assuming that the power source part is accommodated in the upper stage or the middle stage of the casing 200, the ventilation passage of the cooling air is blocked. However, in the controller 110 and the integral-type device 130 according to this embodiment, the power source part is accommodated in the lower stage of the casing 200 and hence, there is no possibility that the ventilation passage is blocked.

Further, although the logic module 400 which is accommodated in the middle stage of the casing 200 has a short depth compared to the disc drive module 300 which is accommodated in the upper stage, the logic module 400 has a short depth compared to the power source part which is accommodated in the lower stage. Accordingly, by accommodating the logic module 400 in the middle stage of the casing 200, it is possible to ensure the large ventilation passage in the upper stage of the casing 200 and, at the same time, it is possible to ensure a space for the ventilation passage also in the middle stage. Here, the logic module 400 has, different from the disc drive module 300, the structure which allows the ventilation inside of the module in the vertical direction and hence, as shown in FIG. 8, it is possible to accommodate the logic modules 400 in the casing 200 such that the logic module 400 at the front-surface side and the logic module 400 at the rear-surface side are arranged to close to each other. Due to such a constitution, the air inside of the power source part and the logic module 400 sucked by the logic module fan 410 can be effectively supplied to the ventilation passage formed in the upper stage of the casing 200.

Figure 12:
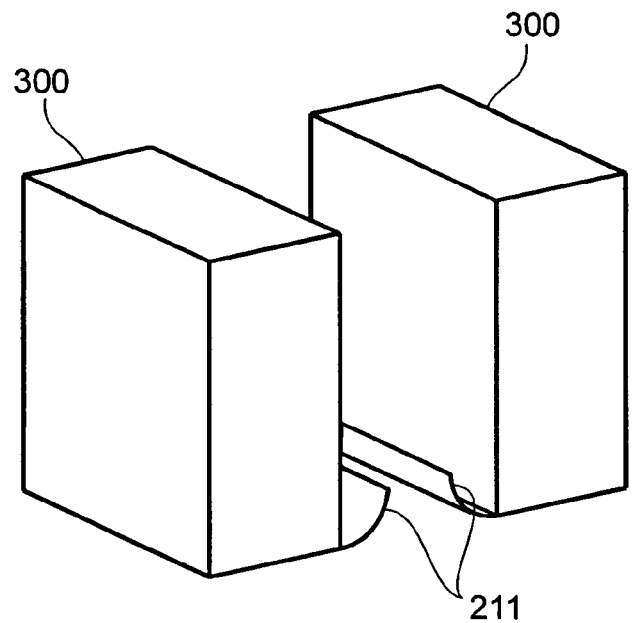
FIG. 12 is a view showing a flow regulating body provided to a storage device according to an embodiment of the present invention.

When the cooling structure shown in FIG. 8 is adopted, in the ventilation passage formed in the upper stage of the casing 200, the cooling wind from the disc drive module 300 and the cooling wind from the logic module 400 and the power source part are merged with each other. When the flow of cooling wind is disturbed at the time that the cooling winds merged with each other, the air inside of the casing 200 stays or becomes stagnant and becomes a cause for lowering the discharge efficiency. Here, FIG. 9 shows the cooling structure for suppressing the disturbance which is generated when the cooling winds are merged with each other. That is, as shown in FIG. 9, flow regulating fins 211 are arranged inside of the casing 200. Due to such a constitution, it is possible to suppress the disturbance of the cooling wind when the cooling wind from the disc driver module 300 and the cooling wind from the logic module 400 and the power source part impinge on each other. FIG. 12 is a view which shows flow regulating fins 211.

Figure 13:
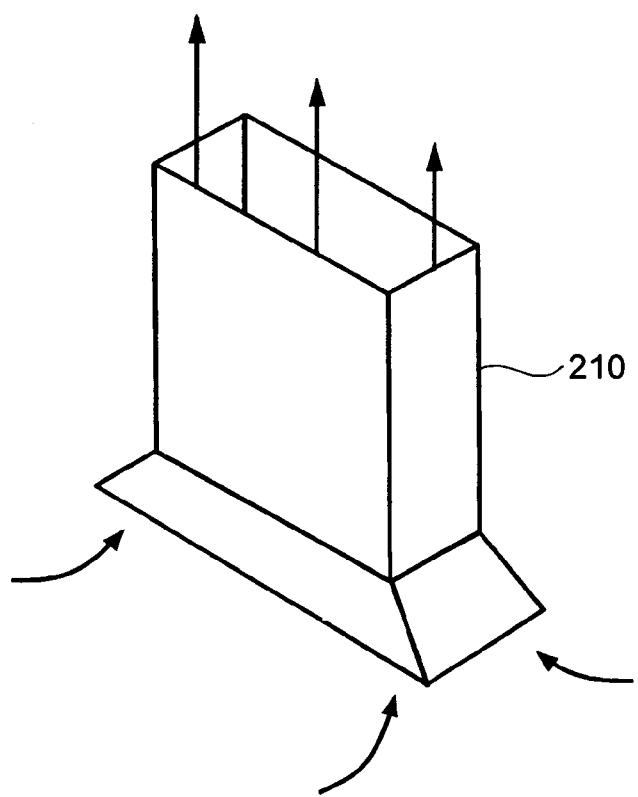
FIG. 13 is a view showing a flow regulating body provided to a storage device according to an embodiment of the present invention.

However, even when the flow regulating fins 211 are used, the cooling wind from the disc drive module 300 and the cooling wind from the logic module 400 are merged with each other before they reach the fan 500. In view of the above, the cooling structure shown in FIG. 10 is provided for separating the cooling wind from the disc drive module 300 and the cooling wind from the logic module 400 and the power source part as much as possible to enhance the discharge efficiency. That is, as shown in FIG. 10, hollow air ducts 210 having two open faces are arranged in the upper stage of the casing 200. The view which indicates the air ducts 210 is shown in FIG. 13.

The air duct 210 according to this embodiment includes the first opening face at the side which faces the vent portion and a second opening face at the side which faces the middle stage of the casing 200, wherein the air duct 210 is configured to have a portion where an area of an imaginary opening face which is formed imaginarily by a cross section parallel to the second opening face is increased as the cross section is made closer to the second opening face. Further, the second opening face has a substantially rectangular shape, wherein a length of one side is substantially equal to a width of the disc drive module 300 and a length of another side is substantially equal to a distance between opposing surfaces of respective disc drive modules 300 which are accommodated in the front face side and the rear face side. Due to such a constitution, the cooling winds generated from the middle stage and the lower stage due to the actuation of the logic module fan 410 can be effectively introduced into the inside of the air duct 210 whereby the air discharge efficiency can be enhanced.

Further, by arranging the air duct 210 inside of the casing 200, the cooling wind from the logic module 400 and the power source part reaches the fan 500 through the inside of the air duct 210, while the cooling wind from the disc drive module 300 reaches the fan 500 along the outer wall surface of the air duct 210. Accordingly, it is possible to prevent the cooling wind from the disc drive module 300 and the cooling wind from the logic module 400 from merging to each other. Further, respective disc drive modules 300 which are accommodated in the upper stage are arranged with the air duct 210 sandwiched therebetween and hence, it is possible to prevent the discharge airs from respective disc drive modules 300 from colliding each other. Accordingly, the disturbance of the cooling wind in the ventilation passage can be suppressed so that the discharging of air can be performed smoothly. Further, since the air duct 210 is configured to increase the area of the imaginary cross section as the imaginary cross section approaches the second opening face, the direction of the air discharged from the disc drive modules 300 is changed to the direction toward the ceiling by the outer wall surface of the air duct 210. Accordingly, it is possible to smoothly discharge the air which is discharged from the disc drive modules 300 to the outside of the casing 200. Further, the first opening face of the air duct 210 and the fan 500 are spaced apart from each other to prevent them from coming into close contact with each other. Due to such a constitution, it is possible to prevent the air suction force generated by the fan 500 from being interrupted by the outer wall of the air duct 210 and hence, it is possible to powerfully discharge the air disposed inside and outside the air duct 210 outside the casing 200.

Next, the cooling structure in the driver 120 according to this embodiment is shown in FIG. 11.

The cooling structure in the driver 120 has the structure which includes the air duct 210 in the upper stage of the casing 200 in the same manner as the cooling structure in the controller 110 and the integral-type device 130 shown in FIG. 10. The constitution which makes the cooling structure of this embodiment different from the cooling structure in the controller 110 and the integral-type device 130 lies in that the disc drive modules 300 are accommodated in the middle stage of the casing 200. In this case, the cooling wind from the disc drive modules 300 which are accommodated in the middle stage of the casing 200 and the cooling wind from the power source part which is accommodated in the lower stage of the casing 200 are discharged outside the driver 120 through the inside of the air duct 210. Further, the cooling wind from the disc drive modules 300 which are accommodated in the upper stage of the casing 200 is discharged outside the driver 120 along the outer wall surfaces of the air duct 210. Since the disc drive modules 300 are accommodated in the middle stage of the casing 200 in the driver 120, it is possible to ensure a large ventilation passage in the middle stage compared to the controller 110 and the integral-type device 130. Accordingly, it is possible to perform the smooth discharge of air from the disc drive modules 300 which are accommodated in the middle stage of the casing 200 and the smooth discharge of air from the power source part which is accommodated in the lower portion of the casing 200. In this manner, also in the driver 120, by arranging the air duct 210 in the casing 200, it is possible to discharge air while preventing the cooling wind from the disc drive modules 300 in the upper stage of the casing 200 and the cooling wind from the disc drive modules 300 in the middle and lower stages and the power source part from merging to each other. Due to such a constitution, also in the driver 120, it is possible to efficiently perform cooling of the disc drive modules 300.

Figure 14:
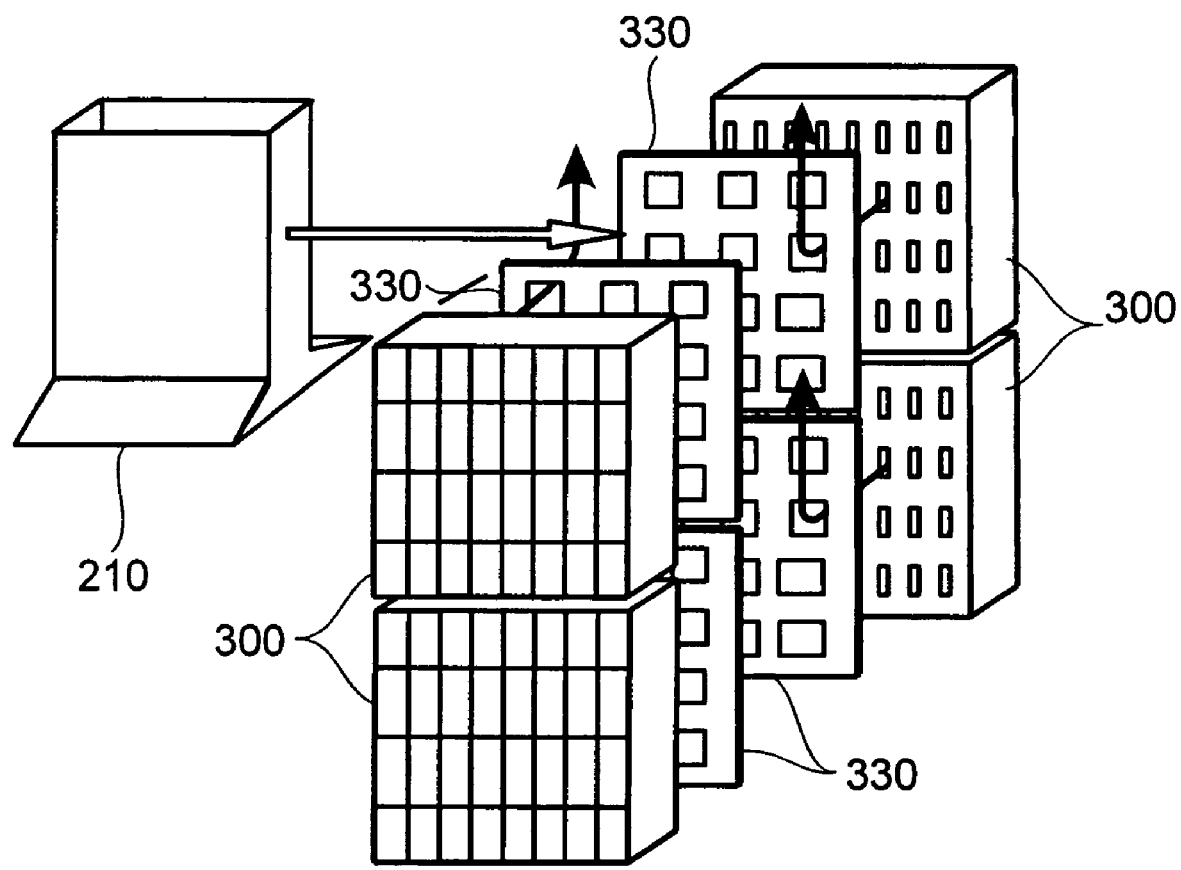
FIG. 14 is a view for explaining a resistance body provided to a storage device according to an embodiment of the present invention.
Figure 15:
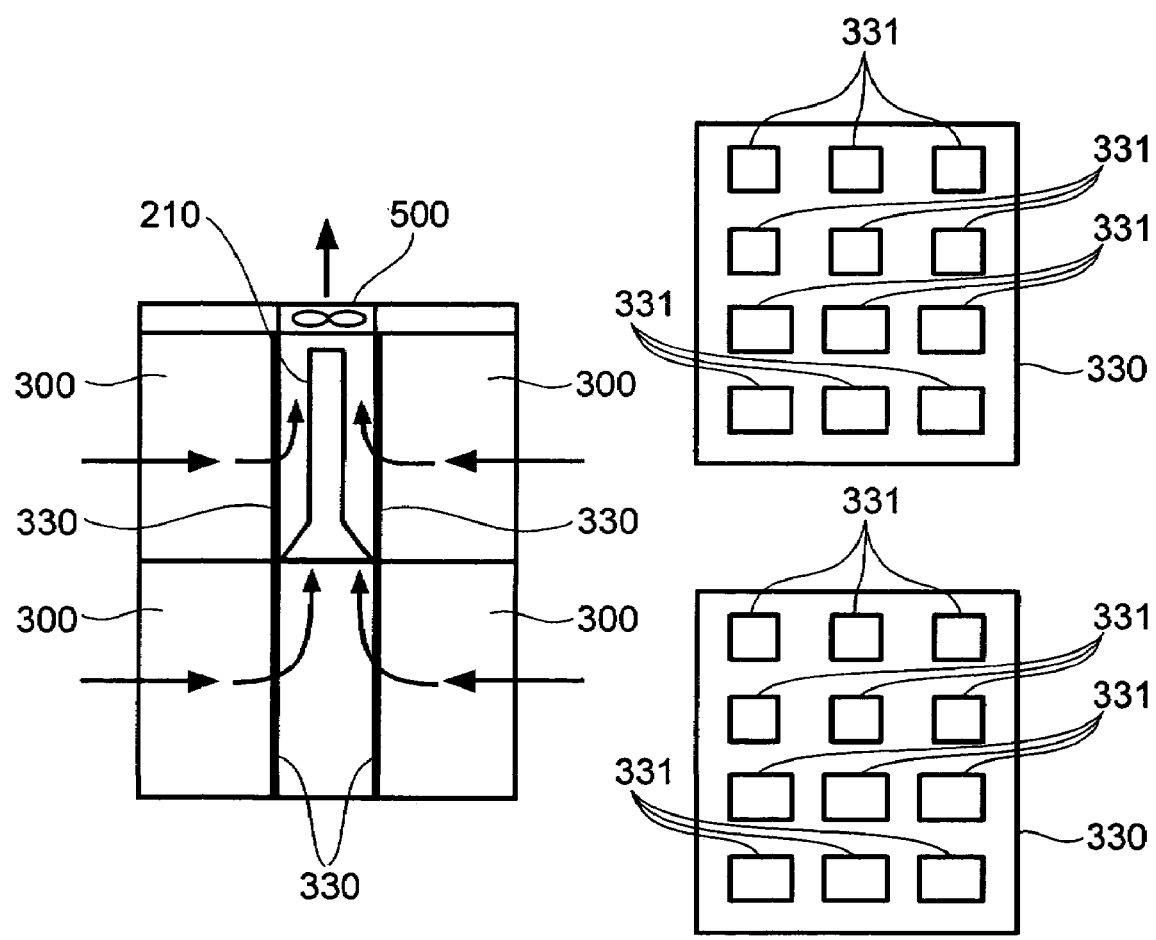
FIG. 15 is a view for explaining a resistance body provided to a storage device according to an embodiment of the present invention.
Figure 16:
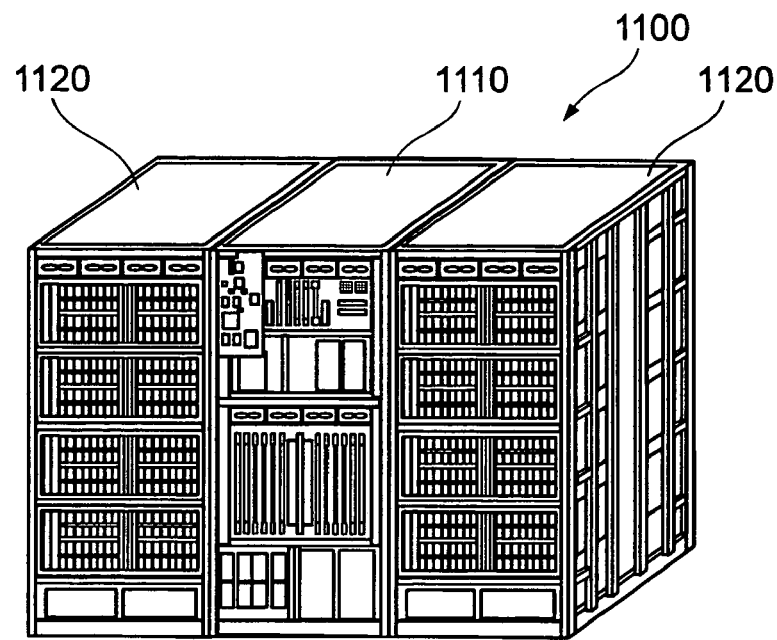
FIG. 16 is a view showing the constitution in appearance of a conventional storage device.
Figure 17:
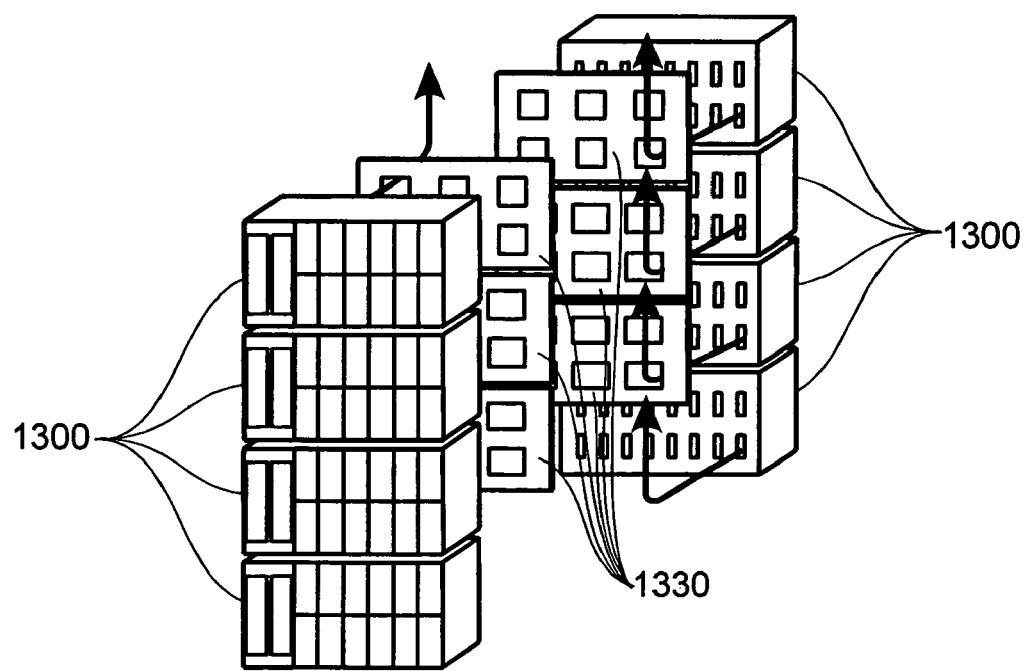
FIG. 17 is a view for explaining a resistance body provided to a conventional storage device.
Figure 18:
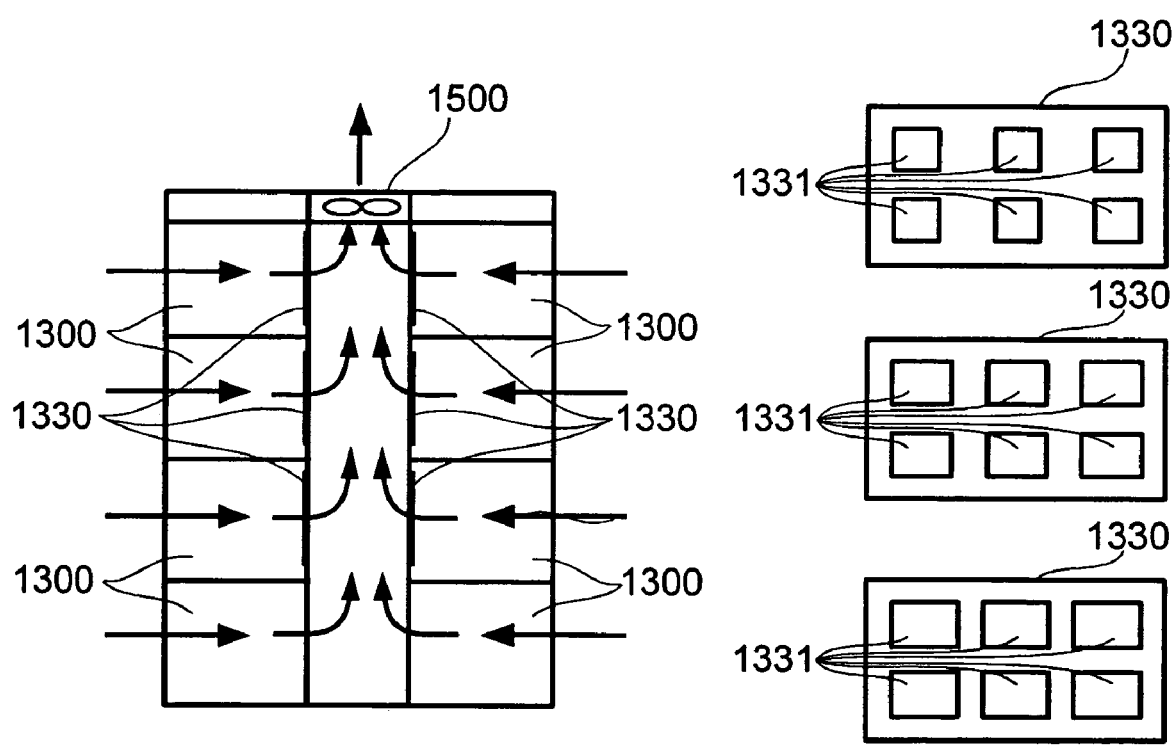
FIG. 18 is a view for explaining a resistance body provided to a conventional storage device.

Further, in the storage device 100 according to this embodiment, flow regulating plates (resistance plates) 330 are disposed. These flow regulating plates 330 are provided for regulating the flow of the cooling wind inside the casing 200 so as to make the cooling wind uniformly flow inside the casing 200. A state in which the flow regulating plates 330 are arranged inside the casing 200 and the cooling wind flows through the flow regulating plates 330 is shown in FIG. 14 and FIG. 15. FIG. 14 and FIG. 15 show a case in which the flow regulating plates 330 are disposed in the driver 120.

The flow regulating plates 330 are arranged such that the flow regulating plates 330 face respective opposing faces of two disc drive modules 300 which are accommodated in the upper stage of the casing 200 with the air duct 210 sandwiched therebetween and respective opposing faces of two disc drive modules 300 which are accommodated in the middle stage of the casing 200.

Air inside the casing 200 is sucked by the fan 500 which is arranged on the ceiling and is discharged outside the casing 200. Here, air in the respective drive modules 300 flows as indicated by an arrow in FIG. 14 and FIG. 15 and is discharged through vent holes 331 formed in the flow regulating plates 330.

In general, when the air inside the disc drive modules 300 which are accommodated in multiple stages inside the casing 200 is discharged inside the casing 200 in a collective manner, the discharged airs from the respective disc drive modules 300 are mixed inside the casing 200 and hence, there arises a dead or stagnant state in the air flow. Particularly, the discharged air from the disc drive modules 300 accommodated in the stage at a side remote from the ceiling receives the influence of the discharged air from the disc drive modules 300 accommodated in the stage at a side close to the ceiling and is liable to generate a dead or stagnant state. Accordingly, in a conventional storage device 1100 shown in FIG. 16 to FIG. 18, several ideas are applied to flow regulating plates 1330 for regulating the cooling wind discharged from disc drive modules 1300 of respective stages so as to prevent such a phenomenon.

In the driver 1120 of the conventional storage device 1100, two disc drive modules 1300 are arranged inside a casing such that they are spaced apart from each other while making back surfaces thereof face each other in an opposed manner thus forming one unit, and the units are accommodated in the casing in a stacked manner in four stages. Then, upon actuation of a fan 1500 arranged on a ceiling of the casing, air inside the disc drive modules 1300 is collected to a ventilation passage at the center of the casing which is defined by a gap between the back surfaces of the disc drive modules 1300 and then is discharged from the fan 1500 mounted on an upper surface of the casing.

Further, the size of vent holes 1331 formed in the flow regulating plates 1330 which are arranged on back surfaces of respective disc drive modules 1300 is set such that the flow regulating plate 1330 which is arranged in the stage closer to the fan 1500 has the smaller vent holes 1331 and the flow regulating plate 1330 which is arranged in the stage remoter from the fan 1500 has the larger vent holes 1331. Due to such a constitution, a quantity of discharged air from the disc drive modules 1300 accommodated in the stage at a side close to the ceiling is suppressed and hence the discharged air from the disc drive modules 1300 accommodated in the stage at a side close to the ceiling hardly gives influence to the discharged air from the disc drive modules 1300 which are accommodated in the stage at a side remote from the ceiling whereby the generation of dead or stagnant state of air sucked by the fan 1500 can be prevented. In an example shown in FIG. 17 and FIG. 18, the flow regulating plate 1330 per se is not arranged in a stage remotest from a fan 1500.

However, in the conventional storage device 1100, since different kinds of flow regulating plates 1330 are used corresponding to the distance from the fan 1500, there has been problems such as the elevation of unit costs of parts, the increase of number of parts and the like. Accordingly, there has been a demand for the realization of common use of the flow regulating plates 1330.

In the driver 120 according to this embodiment, as shown in FIG. 14 and FIG. 15, the flow regulating plates 330 are used in common. That is, the flow regulating plate 330 arranged in the upper stage of the casing 200 and the flow regulating plate 330 arranged in the middle stage of the casing 200 are formed of flow regulating plates 330 of the same standard having the same Vent holes 331. The reason that the common use of the flow regulating plates 330 is realized is that by arranging the air duct 210 in the upper stage of the casing 200, it is possible to prevent the discharged air from the disc drive modules 300 accommodated in the stage remote from the fan 500 from being influenced by the discharged air from the disc drive modules 300 accommodated in the stage close to the fan 500. Due to such a constitution, it is possible to reduce the number of parts of the storage device 100 and, at the same time, the unit costs of parts can be reduced and the manufacturing of storage device can be facilitated. Here, although a plurality of vent holes 331 are formed in each flow regulating plate 330, in each flow regulating plate 330, the vent holes 331 which are formed in the lower portion of the flow regulating plate 330 have a larger bore size. This is because the provision can suppress a quantity of air discharged from the vent holes 331 formed in the upper side of the flow regulating plate 330 so that the air discharged from the vent hole 331 formed in the lower side of the flow regulating plate 330 can be discharged without generating a dead or stagnant state.

In the storage device 100 according to this embodiment, by adopting the above-mentioned cooling structure, it is possible to accommodate the power source part in the lower portion of the casing 200. Accordingly, the power source system can be simplified such that it is no more necessary to arrange the wiring of AC power in the inside of the casing 200. At the same time, the anti-noise characteristics of the storage device 100 can be enhanced. Further, the safety at the time of manufacturing and inspecting can be also enhanced. Still further, by providing voltage converters to the disc drive modules 300 and the logic module 400 thus integrating the rated voltages of DC power supplied to the disc drive modules 300 and the logic module 400 from the power source part to one type, it is also possible to realize the simplification of the power source system.

Figure 19:
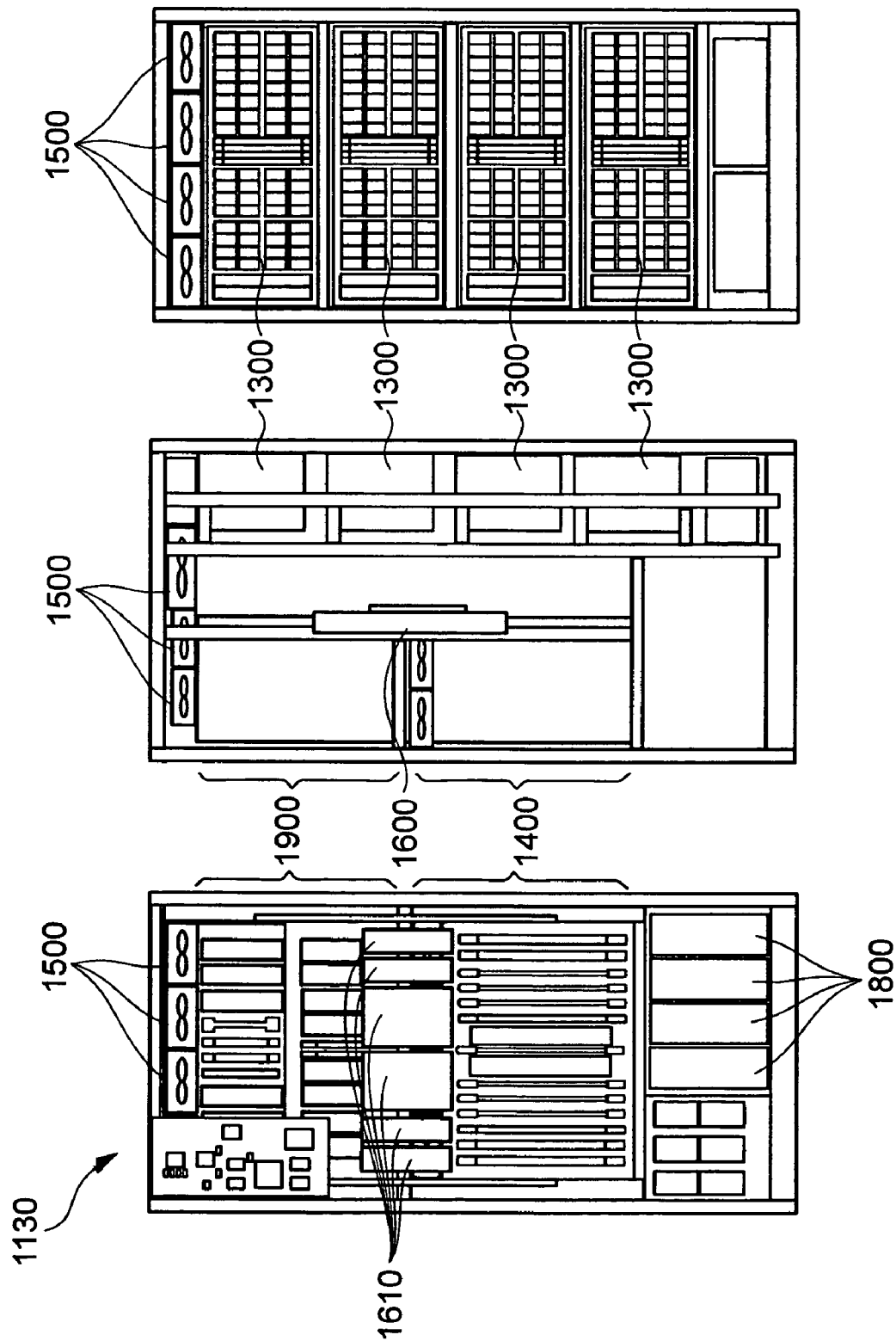
FIG. 19 is a view for explaining a bus bar provided to a conventional storage device.
Figure 20:
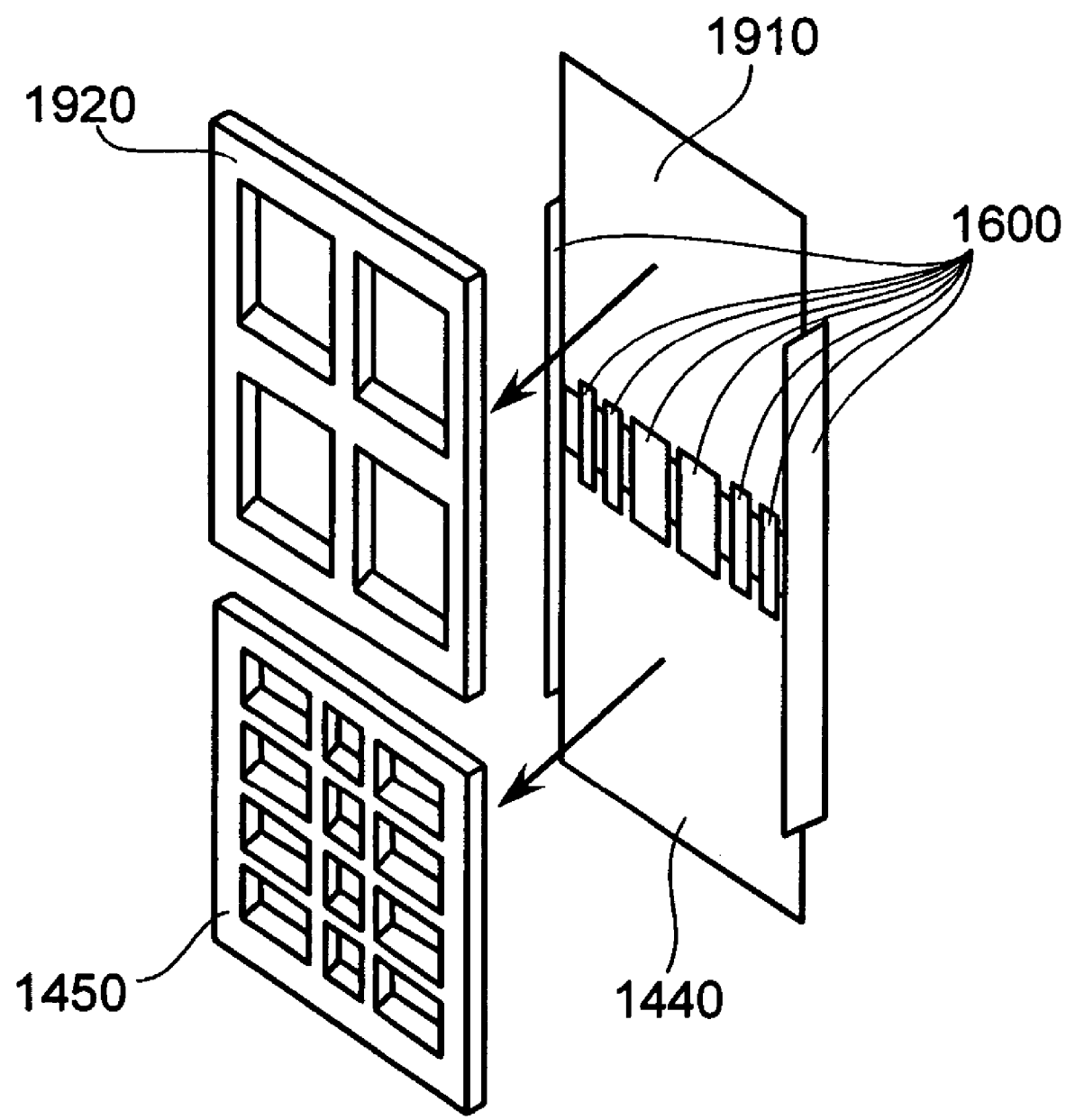
FIG. 20 is a view for explaining a bus bar provided to a conventional storage device.

This state is shown in FIG. 19 to FIG. 22. FIG. 19 and FIG. 20 show a state in which in a conventional storage device 1100 adopting an integral-type device (corresponding to the integral-type device 130 of this embodiment) 1130, power having a plurality of rated voltages is supplied to the logic module (corresponding to the logic module 400 according to this embodiment) 1400 from the power source module (corresponding to the DC power source 600 according to this embodiment) 1900.

As shown in FIG. 20, in the conventional storage device 1100, the supply of electric power from the power source module 1900 to the logic module 1400 is performed by connecting a power source module substrate 1910 and a logic module substrate 1440 using bus bars 1610. The bus bar 1610 is a metal plate served for supplying electric power from the power source module 1900 to the logic modules 1400. Since the large electric power is supplied to the logic modules 1400 from the power source module 1900, usual wire harnesses cannot ensure the sufficient allowable electricity supply quantity. Accordingly, the supply of electric power is performed using the metal plates such as the bus bars 1610. A power source module substrate 1910 is arranged at a depth-side of an upper stage of an integral-type-device casing 1220 together with a power source module reinforcing plate 1920. By accommodating the power source module 1900 in the integral-type-device casing 1220, an electric connector mounted on the power source module 1900 is connected with an electric connector mounted on the power source module substrate 1910 by fitting engagement. On the other hand, a logic module substrate 1440 is arranged at a depth-side of a middle stage of the integral-type-device casing 1220 together with a logic module reinforcing plate 1450. By accommodating the logic module 1400 in the integral-type-device casing 1220, an electric connector mounted on the logic module 1400 is connected with an electric connector mounted on the logic module substrate 1440 by fitting engagement. In this manner, it is possible to electrically connect the power source module 1900 and the logic module 1400 to each other whereby the electric power can be supplied from the power source module 1900 to the logic module 1400. However, in the conventional storage device 1100, it is necessary to supply the DC electric power of a plurality of rated voltages to the logic modules 1400 from the power source module 1900.

Accordingly, as shown in FIG. 20, the kinds and the number of bus bars 161 necessary for connecting the power source module substrate 1910 and the logic module substrate 1440 are increased whereby the arrangement of the bus bars 1610 requires designing. As shown in FIG. 20, there has been also a case that it is necessary to arrange the long bus bar 1610 on side face portions of the power source module substrate 1910 and the logic module substrate 1440. FIG. 19 shows a state in which, inside the conventional integral-type device 1130, the power source module 1900 and the logic module 1400 are connected by the bus bars 1610. Further, as shown in FIG. 19, in the conventional integral-type device 1130, the power source module 1900 is accommodated in the upper stage of the integral-type device casing 1220, while the logic modules 1400 are accommodated in the middle stage of the casing 1220. Accordingly, the positional relationship is set such that a logic module fan 1410 is arranged between the power source module 1900 and the logic module 1400 and hence, a length of the bus bars 1610 which sandwich the logic module fan 1410 is elongated.

Figure 21:
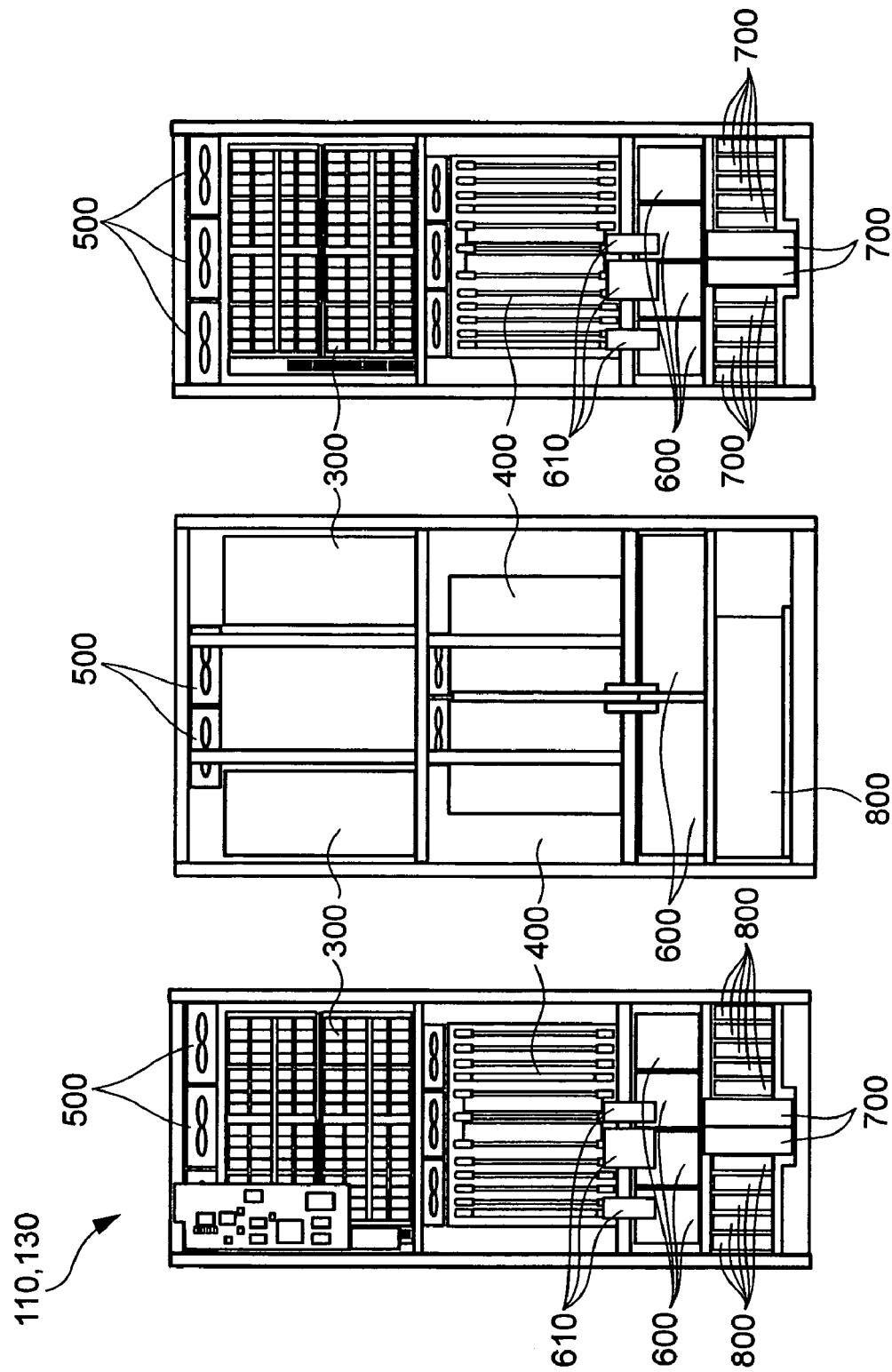
FIG. 21 is a view for explaining a bus bar provided to a storage device according to an embodiment of the present invention.
Figure 22:
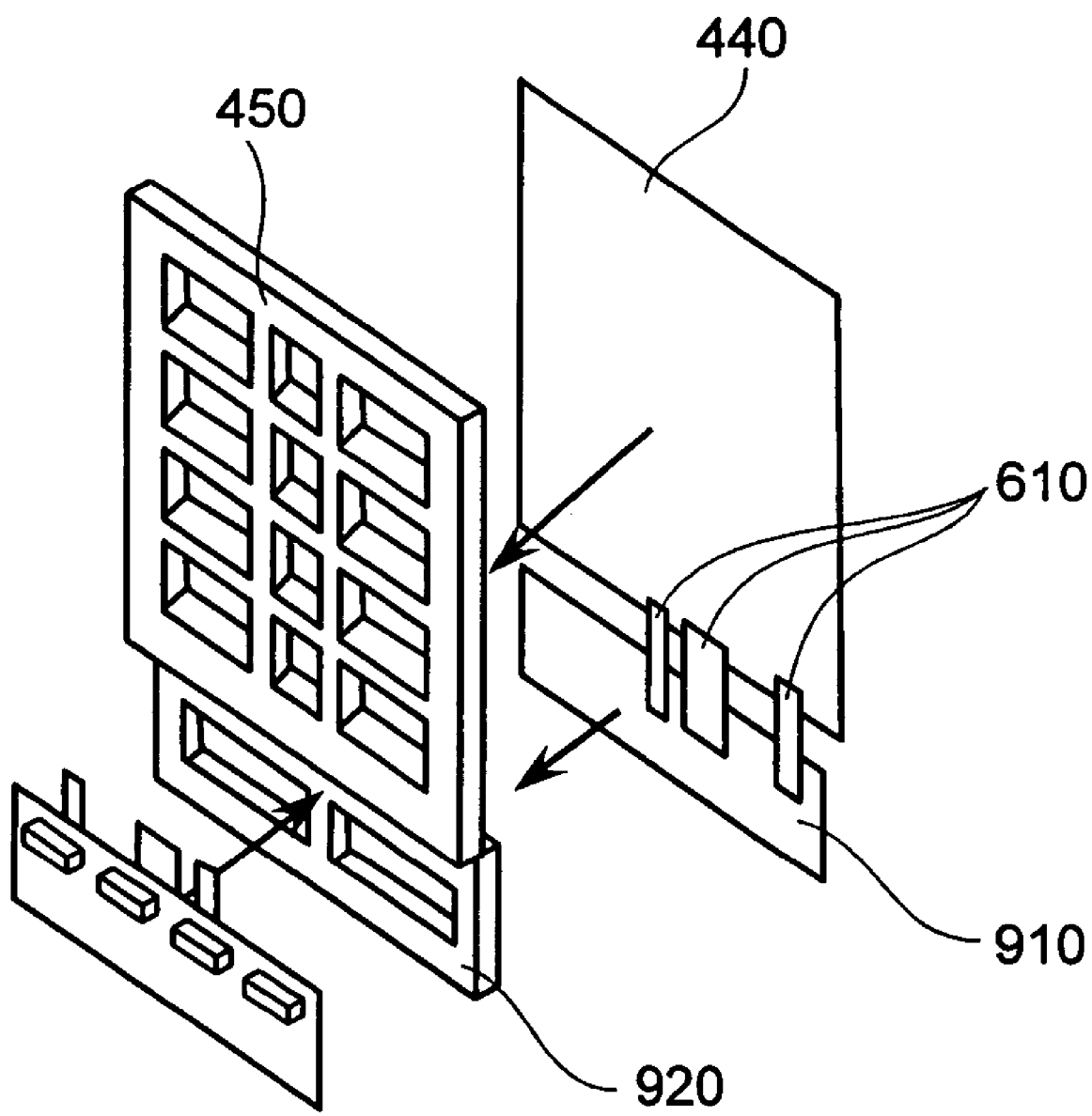
FIG. 22 is a view for explaining a bus bar provided to a storage device according to an embodiment of the present invention.

On the other hand, in the integral-type device 130 of the storage device 100 according to this embodiment, the DC power source 600 is accommodated in a lower stage of the casing 200 and the logic modules 400 are accommodated in the middle stage of the casing 200. Also in the integral-type device 130 of this embodiment, the supply of electric power from the DC power source 600 to the logic modules 400 is performed using the bus bars 610. However, as shown in FIG. 21, since the DC power source 600 is accommodated below the logic modules 400, it is possible to obviate the positional relationship that logic module fan 410 is arranged between the logic module 400 and the DC power source 600. Accordingly, the length of bus bars 610 can be made short. Further, as shown in FIG. 22, also in the integral-type device 130 of this embodiment, the logic module substrate 440 and the DC power source substrate 910 are connected to each other by the bus bars 610. The DC power source substrate 910 is arranged at the depth-side of the lower stage of the casing 200 together with a DC power source reinforcing plate 920. When the DC power source 600 is accommodated in the casing 200, an electric connector mounted on the DC power source 600 and an electric connector mounted on the DC power source substrate 1910 are connected to each other by fitting engagement. On the other hand, the logic module substrate 440 is arranged at a depth-side of the middle stage of the casing 200 together with a logic module reinforcing plate 450. Further, when the logic modules 400 are accommodated in the casing 200, electric connectors 400 mounted on the logic modules 400 and electronic connectors mounted on the logic module substrate 440 are connected to each other by fitting engagement. In this manner, the DC power source 600 and the logic modules 400 are electrically connected to each other and hence, the electric power is supplied to the logic modules 400 from the DC power source 600. As shown in FIG. 21 and FIG. 22, in this embodiment, the number of bus bars 610 can be decreased compared to the conventional technique. Further, the length of bus bars 610 can be also made short. This is because, as mentioned previously, in the storage device 100 according to this embodiment, only one kind of voltage is used as the voltage of the DC power to be supplied to the logic modules 400 from the DC power source 600 and the DC power source 600 can be accommodated below the logic modules 400.

As has been explained heretofore, according to the cooling structure of the electronic device of this embodiment, air from the electronic devices accommodated in the middle stage and the lower stage of the casing can be efficiently introduced into the air duct and, thereafter, can be discharged. Further, air from the electronic devices accommodated in the upper stage of the casing can be made to reach the ceiling of the casing along the outer wall surfaces of the air duct and, thereafter, can be discharged. Accordingly, it is possible to efficiently discharge air from respective electronic devices in the casing.

Further, due to such a constitution, it is possible to accommodate the power source part in the lower portion of the casing. Accordingly, wiring and cabling relevant to the power source inside the casing can be simplified and, at the same time, the reduction of number of parts and the common use of parts can be realized.

Although the case in which the present invention is applied to the storage device has been explained in respective embodiments of the present invention, the present invention is applicable to equipment which accommodates various electronic devices. For example, the present invention is applicable to cooling of a computer equipment as represented by a large-scale computer, various measuring equipment, controller and the like, or various electronic equipment mounted on automobiles and airplanes.

Although several embodiments have been explained heretofore, the above-mentioned embodiments are provided for facilitating the understanding of the present invention and should not be used to construe the present invention in a limitative manner. The present invention can be changed and improved without departing from the gist of the present invention and includes equivalents of the present invention.

According to the present invention, it is possible to provide the excellent cooling structure for electronic devices.

What is claimed is:

1. A cooling structure for electronic devices wherein
   a plurality of electronic device accommodating boxes, in which electronic devices are accommodated, are disposed in a casing in multiple stages,
   a vent portion which allows ventilation between the inside and the outside of the casing is formed in a ceiling of the casing,
   in a first accommodating portion for accommodating the first electronic device accommodating box which is defined at the stage close to the ceiling, a hollow duct having two opening faces is arranged,
   the first opening face faces the vent portion,
   the second opening face faces a second accommodating portion for accommodating the second electronic device accommodating box which is defined at the stage remote from the ceiling,
   air inside the second electronic device accommodating box which is accommodated in the second accommodating portion is discharged outside the casing from the vent portion through the inside of the duct, and
   air inside the first electronic device accommodating box which is accommodated in the first accommodating portion is discharged to the outside of the casing from the vent portion along an outer wall surface of the duct.

2. A cooling structure for electronic devices according to claim 1 wherein a discharging device for discharging air inside the casing outside is arranged in the vent portion, and air inside the first and second electronic device accommodating boxes is discharged outside the casing by the discharging device.

3. A cooling structure for electronic devices according to claim 2 wherein the discharging device and the first opening face are spaced apart from each other.

4. A cooling structure for electronic devices according to claim 1 wherein a shape of the duct is configured to include a portion in which an area of an imaginary opening face which is imaginary formed of a cross section parallel to the second opening face is increased as the cross section approaches the second opening face.

5. A cooling structure for electronic devices according to claim 4 wherein
   two first electronic device accommodating boxes are accommodated in the first accommodating portion in an opposed manner such that two first electronic device accommodating boxes sandwich the duct,
   the imaginary opening face has a substantially rectangular shape, and
   the second opening face has one side thereof set to a length substantially equal to a width of the first electronic device accommodating box and another side thereof set to a length substantially equal to a distance between opposing faces of two first electronic device accommodating boxes which face each other.

6. A cooling structure for electronic devices according to claim 1 wherein
   two first electronic device accommodating boxes are accommodated in the first accommodating portion in an opposed manner such that two first electronic device accommodating boxes sandwich the duct,
   two second electronic device accommodating boxes are accommodated in the second accommodating portion in an opposed manner such that two second electronic device accommodating boxes face lower portions of the first electronic device accommodating boxes in an opposed manner,
   resistance plates which adjust an air volume by having vent holes are arranged on respective faces of two first electronic device accommodating boxes in an opposed manner, and
   resistance plates which adopt a standard equal to a standard of the resistance plates and have vent holes equal to the vent holes of the resistance plates are arranged on respective faces of two second electronic device accommodating boxes in an opposed manner.

7. A cooling structure for electronic devices according to claim 1 wherein
   the electronic devices accommodated in the first electronic device accommodating boxes are disc drives, and
   the electronic devices accommodated in the second electronic device accommodating boxes are a control board which performs inputting and outputting of data with respect to the disc drives.

8. A cooling structure for electronic devices according to claim 2 wherein
   the electronic devices accommodated in the first electronic device accommodating boxes are disc drives, and
   the electronic devices accommodated in the second electronic device accommodating boxes are a control board which performs inputting and outputting of data with respect to the disc drives.

9. A cooling structure for electronic devices according to claim 3 wherein
   the electronic devices accommodated in the first electronic device accommodating boxes are disc drives, and
   the electronic devices accommodated in the second electronic device accommodating boxes are a control board which performs inputting and outputting of data with respect to the disc drives.

10. A cooling structure for electronic devices according to claim 4 wherein
the electronic devices accommodated in the first electronic device accommodating boxes are disc drives, and
the electronic devices accommodated in the second electronic device accommodating boxes are a control board which performs inputting and outputting of data with respect to the disc drives.

11. A cooling structure for electronic devices according to claim 5 wherein
the electronic devices accommodated in the first electronic device accommodating boxes are disc drives, and
the electronic devices accommodated in the second electronic device accommodating boxes are a control board which performs inputting and outputting of data with respect to the disc drives.

12. A cooling structure for electronic devices according to claim 6 wherein
the electronic devices accommodated in the first electronic device accommodating boxes are disc drives, and
the electronic devices accommodated in the second electronic device accommodating boxes are a control board which performs inputting and outputting of data with respect to the disc drives.

13. A cooling structure for electronic devices according to claim 1 wherein the electronic devices accommodated in the first and second electronic device accommodating boxes are disc drives.

14. A cooling structure for electronic devices according to claim 2 wherein the electronic devices accommodated in the first and second electronic device accommodating boxes are disc drives.

15. A cooling structure for electronic devices according to claim 3 wherein the electronic devices accommodated in the first and second electronic device accommodating boxes are disc drives.

16. A cooling structure for electronic devices according to claim 4 wherein the electronic devices accommodated in the first and second electronic device accommodating boxes are disc drives.

17. A cooling structure for electronic devices according to claim 5 wherein the electronic devices accommodated in the first and second electronic device accommodating boxes are disc drives.

18. A cooling structure for electronic devices according to claim 6 wherein the electronic devices accommodated in the first and second electronic device accommodating boxes are disc drives.

* * * * *